United States Patent
Commens et al.

(10) Patent No.: US 6,396,274 B1
(45) Date of Patent: May 28, 2002

(54) DUAL-FUNCTION NMR PROBE

(75) Inventors: Matthew H. Commens, Morgan Hill; Justine Y. Lee, Mountain View, both of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/434,098

(22) Filed: Nov. 5, 1999

(51) Int. Cl.$^7$ .................................................. G01V 3/00
(52) U.S. Cl. ........................................ 324/321; 324/318
(58) Field of Search ................................ 324/321, 322, 324/318, 319, 300, 306

(56) References Cited

U.S. PATENT DOCUMENTS

| | | | |
|---|---|---|---|
| 5,258,712 A | 11/1993 | Hofmann et al. | 324/318 |
| 5,397,989 A | * 3/1995 | Spraul et al. | 324/318 |
| 5,867,026 A | 2/1999 | Haner | 324/321 |
| 6,177,798 B1 | * 1/2001 | Haner et al. | 324/300 |

OTHER PUBLICATIONS

Patent Abstracts of Japan entitled "Fixing Device For ESR Sample Tube", vol. 2000, No. 01, Jan. 31, 2000.
Article by Albert Klaus, entitled "Supercritical Fluid Chromatography–Proton Nuclear Magnetic Resonance Spectroscopy Coupling", published in *Journal of Chromatogrphy A*, 785 (1997), pp. 65–83.
Article by Albert Klaus, entitled "Liquid Chromatography–Nuclear Magnetic Resonance Spectroscopy", published in *Journal of Chromatography A*, 856 (1999), pp. 199–211.
Article by Haw et al., entitled "Continuous Flow High Field Nuclear Magnetic Resonance Detector for Liquid Chromatographic Analysis of Fuel Samples," published in *Anal. Chem.* in 1981, vol. 53, pp. 2327–2332.

Article by Barjat et al., entitled "Adaptation of Commercial 500 MHz Probes for LCNMR," published in *Journal of Magnetic Resonance* in 1996, Series A 119, pp. 115–119.
Article by Albert et al., entitled "High–Performance Liquid Chromatography–Nuclear Magnetic Resonance On–Line Coupling," published in *Trends in Analytical Chemistry* in 1988, vol. 7, No. 8, pp. 288–293.
Article by Stevenson et al., entitled "$^{13}$C Dynamic Nuclear Polarization: A Detector For Continuous–Flow, On–Line Chromatography" published in *Anal. Chem.* in 1994, vol. 66, pp. 2993–2999.
U. S. application No. 09/361,658, Commens et al., filed Jul. 22, 1999.

* cited by examiner

Primary Examiner—Louis Arana
(74) Attorney, Agent, or Firm—Bella Fishman; Andrei Popovici

(57) ABSTRACT

Flow cells and stationary-sample vessels (test tubes) are used sequentially in the same dual-function nuclear magnetic resonance (NMR) probe. The user can easily convert the probe between flow and stationary-sample configurations without removing the probe housing. Tapered guiding surfaces are provided for guiding stationary-sample vessels from above and flow cells from below to respective measurement positions. Sample flow connection tubing used during flow measurements is accommodated within the probe during stationary-sample measurements. The dual-function NMR probe is useful in continuous flow-through, stop-flow, and fixed-sample analysis applications, including applications that couple high-pressure liquid chromatography (HPLC) with nuclear magnetic resonance spectroscopy and applications for analyzing small quantities of stationary organic samples.

24 Claims, 9 Drawing Sheets

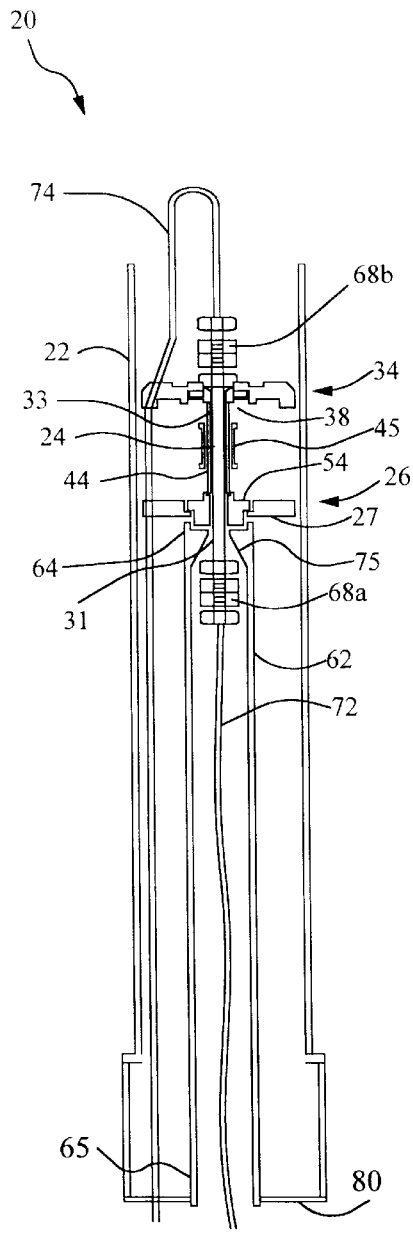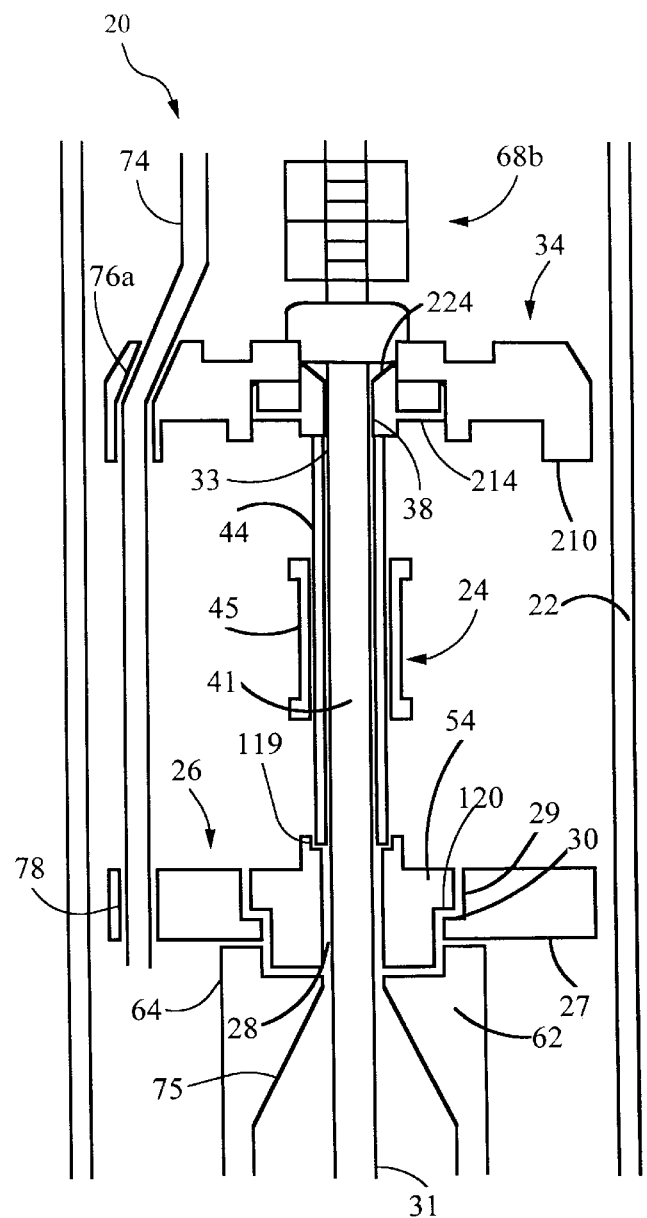
FIG. 2-A
FIG. 2-B

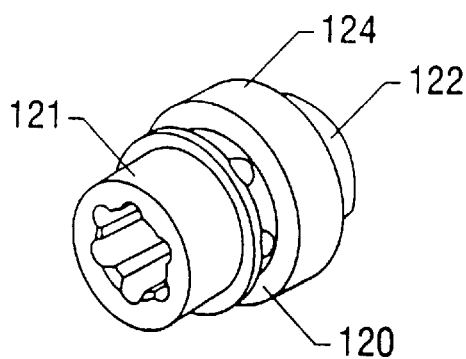
FIG. 3-A
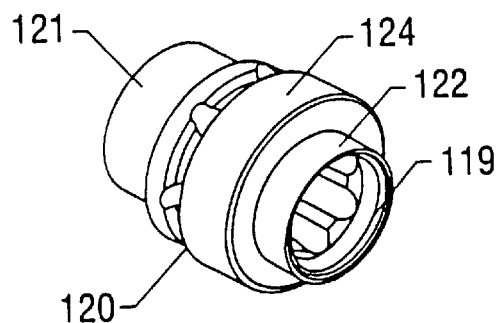
FIG. 3-B
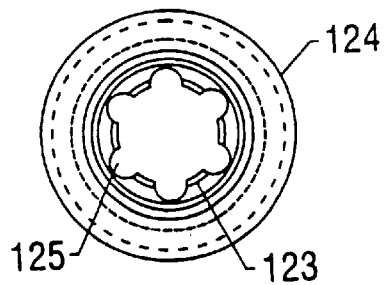
FIG. 3-C

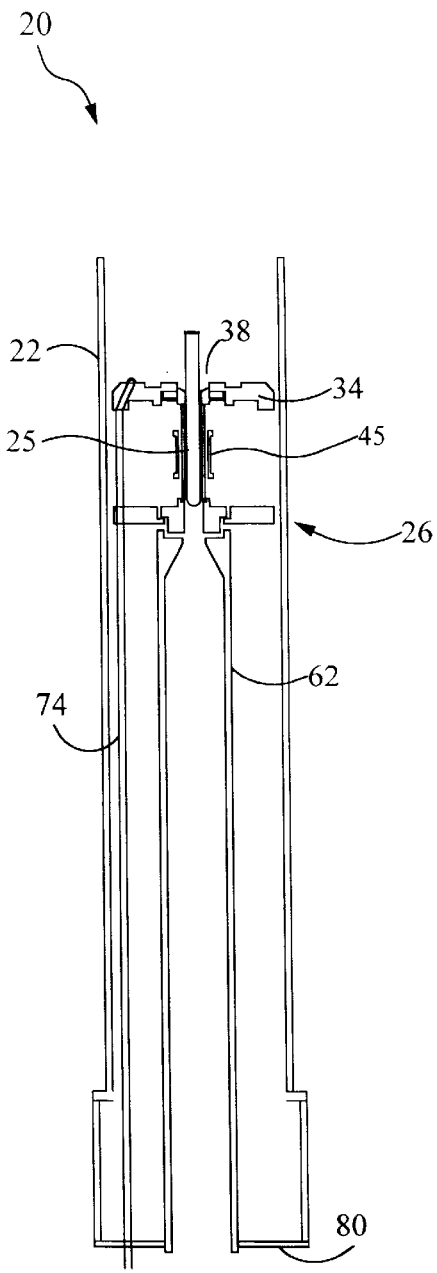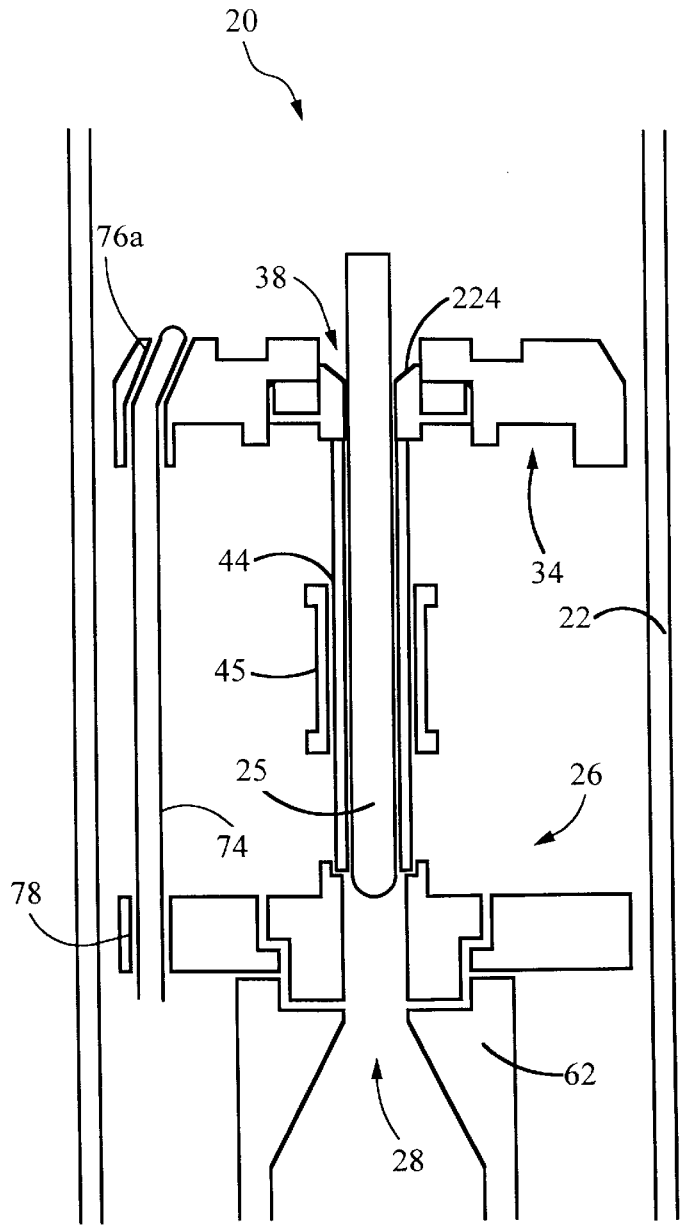
FIG. 5-A
FIG. 5-B

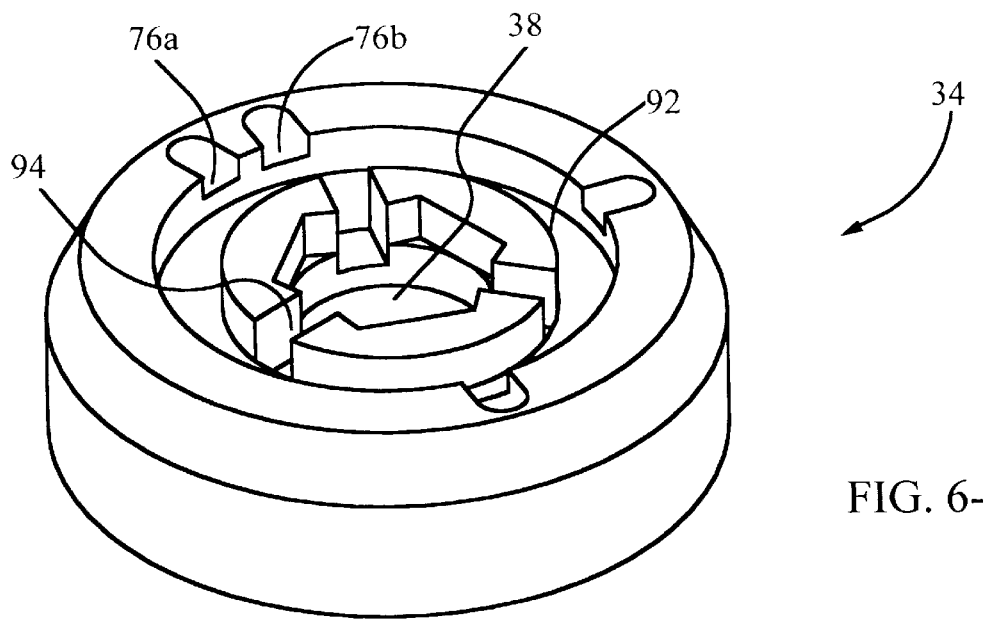
FIG. 6-A
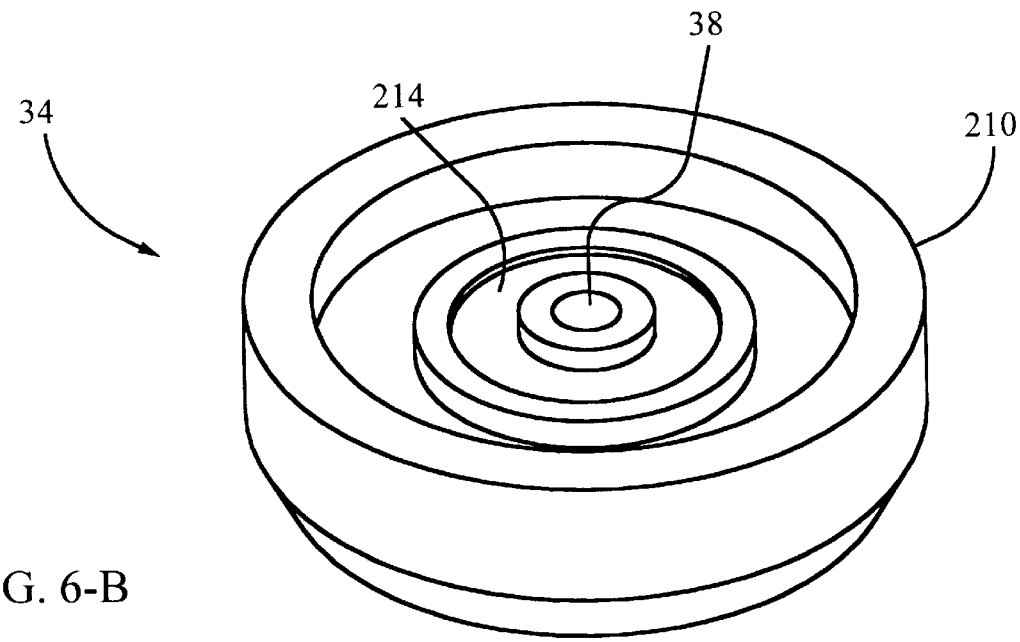
FIG. 6-B

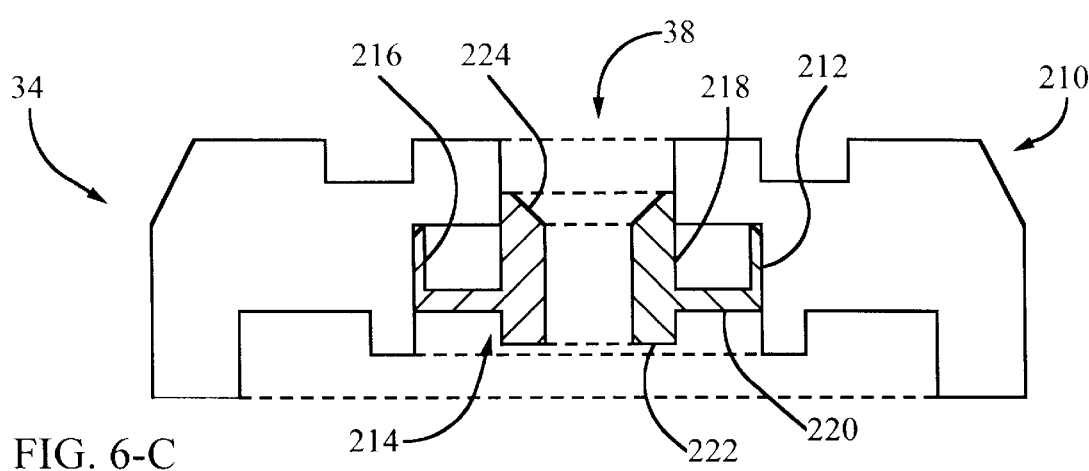
FIG. 6-C
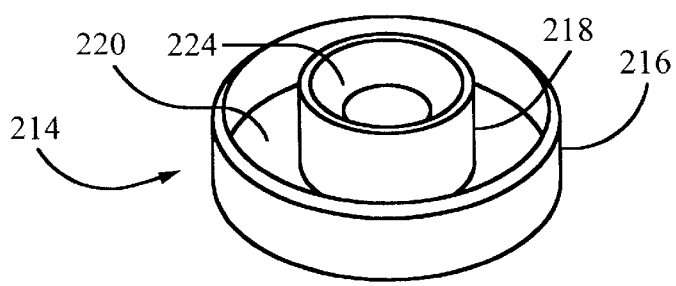
FIG. 7

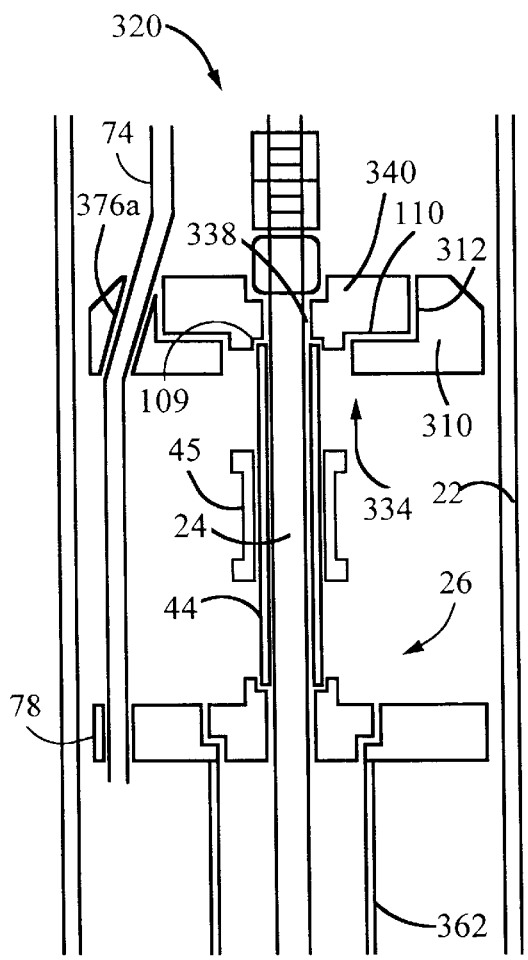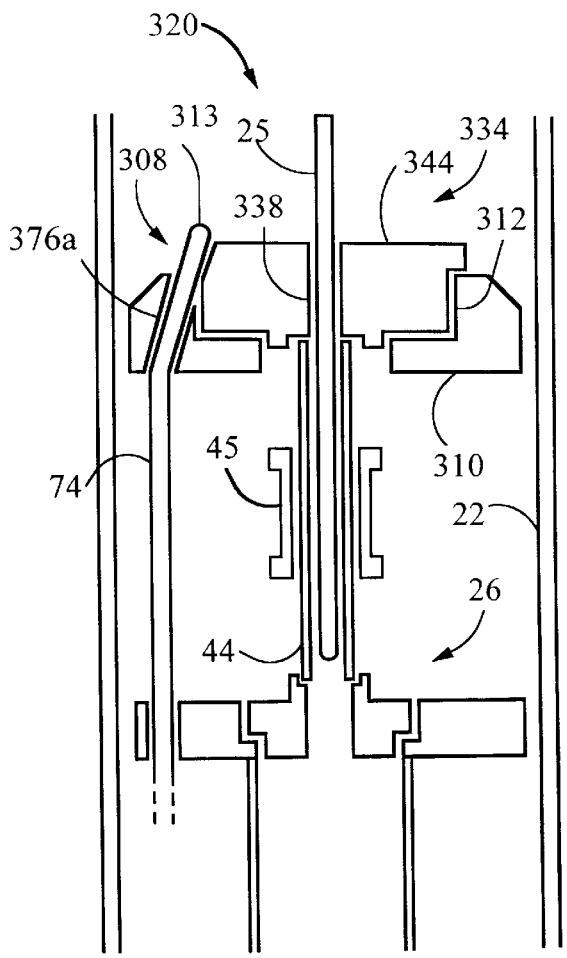
FIG. 8-A
FIG. 8-B

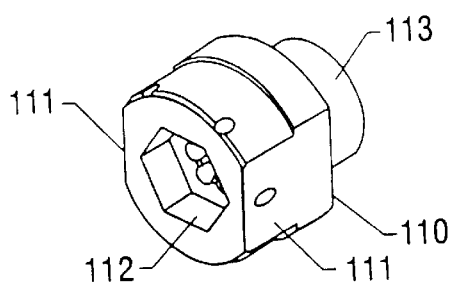
FIG. 9-A
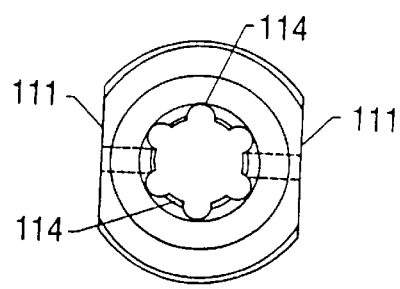
FIG. 9-C
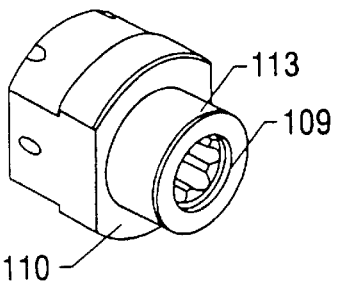
FIG. 9-B
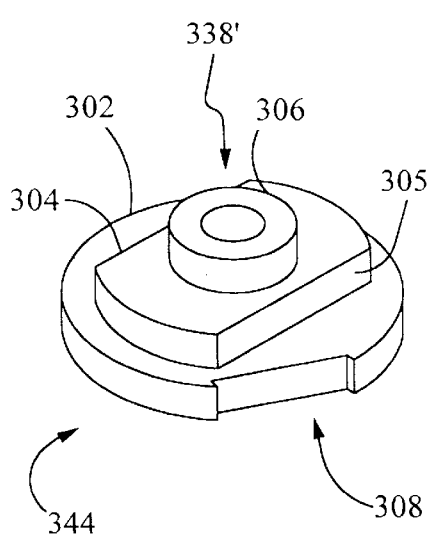
FIG. 10-A
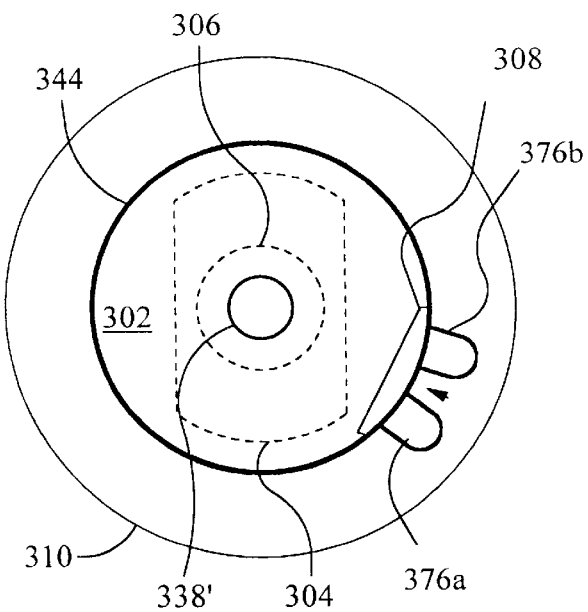
FIG. 10-B

DUAL-FUNCTION NMR PROBE

RELATED APPLICATION DATA

This application is related to U.S. Pat. No. 6,177,198 published on Jan. 23, 2001 and entitled "Flow-Through NMR Probe Having A Replaceable NMR Flow Tube."

FIELD OF THE INVENTION

The invention in general relates to the field of chemical analysis, more particularly to nuclear magnetic resonance spectroscopy (NMR) and high-pressure liquid chromatography (HPLC), and still more particularly to a dual-function NMR probe capable of functioning in alternative modes with either a stationary-sample vessel (test tube) or a flow cell.

BACKGROUND OF THE INVENTION

An NMR apparatus is most often characterized in gross by cylindrical symmetry. A typical NMR magnet is of the superconducting variety and is housed in a dewar which includes a room temperature cylindrical bore in which a very carefully controlled homogeneous magnetic field is sustained by operation of the superconducting magnet in the interior of the dewar. An NMR probe holds a sample placed in the uniform magnetic field. The housing for the probe is typically cylindrical to fit within the bore of the magnet and the sample is generally positioned along the central (longitudinal) axis of the probe. A coil is disposed close to the sample within the probe to apply radio frequency (RF) pulses to the sample. The resultant resonance signal of the sample is picked up by the coil and delivered to measurement electronics. The measurement electronics generate an output signal, and take the Fourier transform of the signal to obtain an NMR spectrum.

NMR spectroscopy has been used with both flow-through and stationary samples. In flow-through NMR, measurements are run as the sample flows through a sample cell. Flow-through NMR is particularly useful when coupled to a separation technique such as high-pressure liquid chromatography. In stationary-sample NMR, the sample is usually placed in a closed test tube, and measurements are performed while the sample remains in the test tube.

Typical NMR probes are customized for use with either flow cells or test tubes. An end user is not typically able to use the same NMR probe with both flow cells and test tubes. While test tubes are easily replaced in conventional systems, conventional NMR flow cell assemblies, including the NMR sample flow cell together with its various connectors and associated tubing for attachment to an HPLC, are delicate, difficult to handle and not well suited for removal or insertion in the field. Removal and insertion of such assemblies in the NMR probe are risky and expensive, at least in part because the flow cells and attached connectors are positioned and secured to the NMR probe within nested assemblies of coils, dewars, and support structures. Many present designs require significant mechanical interaction with these closely mated subassemblies. Electrical manipulations are often needed to exchange the flow cell, such as unsoldering and resoldering of the RF and pulsed field gradient coils. Some designs have RF circuitry directly attached and secured to the flow cells. There is an additional cost and risk associated with exchange of the flow cell in these designs because of the directly secured RF circuitry. Moreover, some manufacturers void a system's warranty if the end user removes the NMR probe housing. As a result, an end user who needs to run both stationary-sample and flow measurements typically uses a separate NMR probe for each measurement type.

SUMMARY OF THE INVENTION

The present invention provides NMR probes, systems, kits and methods allowing the use of a single NMR probe with both flow cells and stationary-sample vessels. The present invention allows an end user in the field to conveniently and quickly convert a probe between flow and stationary-sample configurations, without removing the probe's housing, RF coils, electrical connections, or other sensitive components.

The present invention provides a dual-function nuclear magnetic resonance (NMR) probe comprising a radio-frequency (RF) coil, an upper insulator held in fixed position above the coil, a lower insulator held in fixed position below the coil, and a guide tube held in fixed position below the lower insulator. The upper insulator has an upper longitudinal sample-holding aperture for sequentially centering a stationary-sample vessel and a flow cell in the radio-frequency coil. The upper sample-holding aperture has a tapered guiding section for guiding the stationary-sample vessel from above through the upper insulator. The lower insulator has a lower longitudinal sample-holding aperture aligned with the upper sample-holding aperture, for centering the flow cell within the radio-frequency coil. The guide tube serves to guide the flow cell from below through the lower sample-holding aperture. The stationary-sample vessel and the flow cell are present in the probe sequentially (alternatively).

In the preferred embodiment, the upper insulator comprises an outer part having a longitudinal inner bore, and a guiding/pressing ring mounted within the inner bore. The guiding ring defines the tapered guiding section of the upper sample-holding aperture. The tapered guiding section is preferably formed by a chamfer at an upper edge of the guiding ring, although generally the tapered guiding section can be situated within the guiding/pressing ring. The guiding/pressing ring further serves to flexibly press longitudinally on an insert coupled to the RF coil, for reducing the vibration or other undesired motion of the insert and RF coil. The guiding/pressing ring comprising an outer contact section for engaging the outer part of the upper insulator, an inner contact section for engaging the probe insert, and a longitudinally-flexible intermediate section flexibly connecting the outer section and the inner section of the ring.

At least two longitudinal flow-connection tube apertures formed in the outer part of the upper insulator serve to accommodate a flow connection tube through the upper insulator. The flow connection tube passes through one of the flow-connection tube apertures when the probe is in a flow configuration, and through both flow-connection tube apertures when the probe is in a stationary-sample configuration. In the stationary-sample configuration, the flow connection tube extends out from one of the flow connection tube apertures and into another of the flow connection tube apertures on an external side of the insulator.

In an alternative embodiment, to allow the use of the probe with flow cells and stationary-sample vessels of different transverse sizes, different centering rings are provided for insertion in the upper insulator in the stationary-sample and flow configurations. In the stationary-sample configuration, the upper insulator is formed by an outer part having a longitudinal inner bore, and a stationary-sample vessel centering ring positioned within the inner bore. The stationary-sample vessel centering ring centers the stationary-sample vessel in the radio-frequency coil. In the flow configuration, the upper insulator is formed by the outer part and a flow cell centering ring positioned within the inner bore. The flow cell centering ring centers the flow cell in the radio-frequency coil. The two rings are provided as part of a kit for conveniently converting the NMR probe between its stationary-sample and flow configuration.

BRIEF DESCRIPTION OF THE DRAWINGS

The foregoing aspects and advantages of the present invention will become better understood upon reading the following detailed description and upon reference to the drawings where:

FIGS. 2-A and 2-B show longitudinal cross-sectional views of an NMR probe in a flow-through configuration according to the preferred embodiment of the present invention.

FIGS. 3-A and 3-B show isometric views of a lower-insulator ring according to the preferred embodiment of the present invention.

FIG. 3-C is a cross-sectional end-on view of the ring of FIGS. 3-A and 3-B.

FIGS. 5-A and 5-B show longitudinal cross-sectional views of the NMR probe of FIGS. 2-A and 2-B in a stationary-sample configuration according to the preferred embodiment of the present invention.

FIGS. 6-A and 6-B show isometric views from the top and bottom, respectively, of an upper insulator according to the preferred embodiment of the present invention.

FIG. 6-C is a longitudinal cross-sectional view of the upper insulator of FIGS. 6-A and 6-B.

FIG. 7 shows an isometric view of a guiding/pressing ring of the upper insulator of FIGS. 4-A through 4-C, according to the preferred embodiment of the present invention.

FIGS. 8-A and 8-B show longitudinal cross-sectional views of an NMR probe in flow through and stationary-sample configurations, respectively, according to an alternative embodiment of the present invention.

FIGS. 9-A and 9-B show isometric views of a flow-cell centering ring according to an is alternative embodiment of the present invention.

FIG. 9-C shows a cross-sectional end-on view of the ring of FIGS. 9-A and 9-B.

FIG. 10-A shows an isometric view of a stationary-sample vessel centering ring according to an alternative embodiment of the present invention.

FIG. 10-B shows a cross-sectional end-on view of the ring of FIG. 10-A, positioned in a fixed outer part of an upper insulator.

DETAILED DESCRIPTION OF THE INVENTION

In the following description, the term "longitudinal" is understood to refer to the magnetic field Z-axis. The term "transverse" refers to the X-Y plane defined by the magnetic field. While in the preferred embodiment the terms "upper" and "lower" refer to the direction of gravity, generally, unless explicitly stated otherwise, the terms "upper" and "lower" are understood to be relative terms, not necessarily referring to the direction of gravity. The terms "ring," "bore," and "tube" preferably refer to structures or apertures having circular cross-sections, but generally encompass structures or apertures having non-circular cross-sections. The term "stationary-sample vessel" is understood to refer to vessels through which samples do not ordinarily flow.

The following description illustrates embodiments of the invention by way of example and not necessarily by way of limitation.

Figure 1:
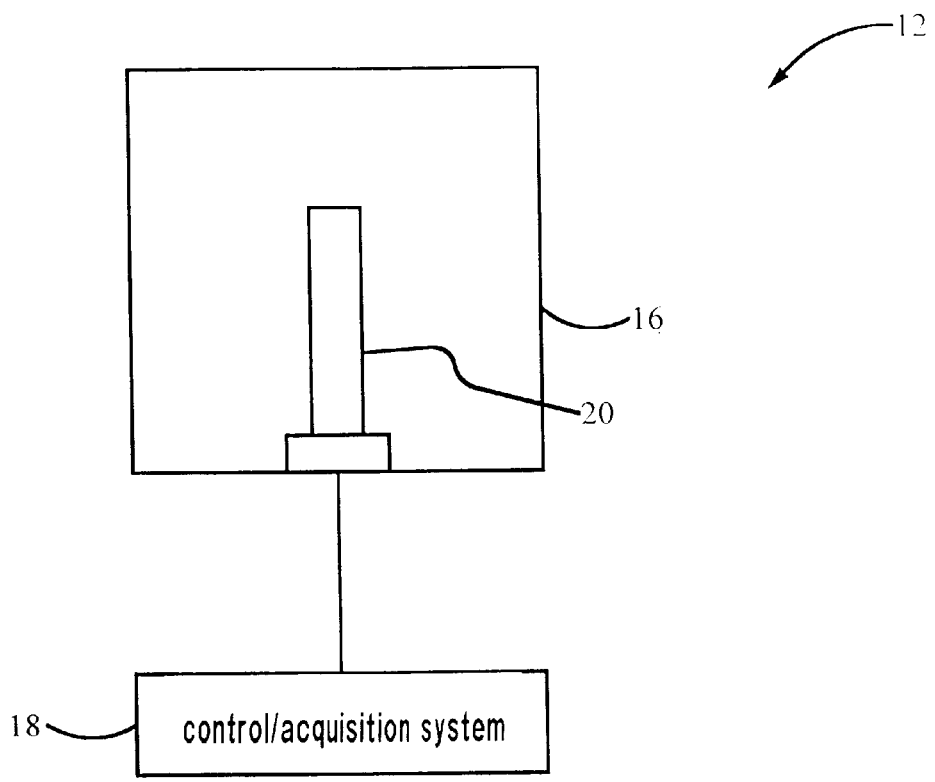
FIG. 1 is a high-level schematic diagram of a nuclear magnetic resonance (NMR) spectrometer incorporating an NMR probe of the present invention.

FIG. 1 is a schematic diagram illustrating a nuclear magnetic resonance (NMR) spectrometer 12 according to the present invention. Spectrometer 12 comprises a magnet 16, an NMR probe 20 inserted in a bore of magnet 16, and a control/acquisition system 18 electrically connected to magnet 16 and probe 20, and fluidically connected to probe 20. Probe 20 holds NMR samples of interest. Magnet 16 applies desired magnetic fields to probe 20. Control/acquisition system 18 applies desired radio-frequency pulses to probe 20, controls the temperature of probe 20, and acquires data indicative of the nuclear magnetic resonance properties of the samples within probe 20. Magnet 16 and control/acquisition system 18 are conventional and will not be described here further.

FIG. 2-A shows a longitudinal cross-sectional view of probe 20 in a flow-through configuration. FIG. 2-B illustrates the sample-holding area of probe 20 in the flow-through configuration. Probe 20 houses the probe subassemblies, including nested assemblies of coils, shields, dewars and support structure not shown in FIG. 2-A. Probe 20 is typically inserted in the upright vertical position into the bore of the superconducting magnet, thereby aligning the central longitudinal (vertical) axis of probe 20 with the vertical axis of the magnet. Probe 20 comprises a generally cylindrical probe housing 22 which fits within the cylindrical bore of the magnet. An NMR flow cell 24 containing a sample of interest is positioned within probe 20 substantially along the longitudinal axis of probe 20 and within the field center of the magnet for spectroscopic measurements. The field center of the magnet is the region of most homogeneous magnetic field.

Flow cell 24 extends along the longitudinal axis of probe 20 through a guide tube 62, a lower insulator 26, and an upper insulator 34. Flow cell 24 is fluidically connected to sample inflow and outflow connection tubes 72, 74 through connectors 68a–b, respectively. A quartz tube insert 44 is centered along the longitudinal axis of probe 20, between lower and upper insulators 26, 34. Insert 44 is preferably coupled to a radio-frequency coil 45.

Lower insulator 26 is supported within probe housing 22. Lower insulator 26 is preferably generally circular so as to fit within the cylindrical housing 22. Lower insulator 26 has a longitudinal sample-holding lower aperture 28 located substantially on the longitudinal axis of probe 20. Lower aperture 28 is preferably a circular hole of sufficient size to permit easy passage of NMR flow cell 24 without restrictions—i.e. on the order of 3–5 mm or more. Flow cell 24 slidably traverses lower insulator 26 through lower aperture 28. Lower insulator 26 may also comprise further apertures, channels, supports and connections for the probe subassemblies.

As illustrated in FIG. 2-B, lower insulator 26 is preferably formed by an outer part 27 affixed to housing 22, and a lower insulator ring 54 mounted on outer part 27. Outer part 27 is generally ring-shaped, so as to fit within the probe housing. A longitudinal inner bore 29 extends through outer part 27, for holding ring 54. A sample flow connection tube aperture 78 is formed in outer part 27, for accommodating sample outflow connection tube 74.

Ring 54 defines lower aperture 28, and acts as a spacer to transversely align flow cell 24 along the longitudinal axis of probe 20. Lower insulator ring 54 further includes a lower constraint (edge, transverse protrusion) 120. Lower constraint 120 bears against a top surface 30 of a step in outer part 27, to aid in adjusting the position of flow cell 24 and to maintain ring 54 in place. Ring 54 can be secured to outer part 27 with conventional fasteners such as set screws, or can be held in place by a press or friction fit. Alternatively, ring 54 and outer part 27 may form one integral piece.

FIGS. 3-A through 3-C illustrate a preferred design for lower insulator ring 54. Ring 54 has a transversely-protruding cylindrical portion 124 for positioning inside and engaging outer part 27 (shown in FIG. 2-B). Portion 124 is flanked from below and above by two other cylindrical portions 121, 122. A lower constraint 120 bears against top surface 30 of outer part 27 (shown in FIGS. 2-A and 2-B). FIG. 3-C shows a cross-sectional view of lower insulator ring 54, including its longitudinal inner aperture for traversing NMR flow cell 24 and centering flow cell 24. Lower insulator ring 54 may comprise channels 125 or other holes to direct air flow past NMR flow cell 24, and internal transverse protrusions 123 for engaging and centering flow cell 24. An upper constraint or ridge 119 in the top of the inner aperture of lower insulator ring 54 is also shown in FIG. 3-C. Ridge 119 accommodates the lower end of insert 44, as shown in FIG. 2-B. Constraint 119 bears against the bottom of insert 44, to align insert 44 along the probe axis and secure insert 44 in place in probe 20.

Referring back to FIG. 2-A, a guide tube 62 is provided for communicating through lower insulator 26 along the longitudinal axis of probe 20. Guide tube 62 has a top end 64 and a bottom end 65. Guide tube 62 is attached at top end 64 to the bottom of lower insulator 26. The attachment may be by a tight friction fit, permanent bond or preferably by threaded connection. Guide tube 62 preferably extends to the base 80 of housing 22.

Guide tube 62 is generally cylindrical and has a smooth inner surface. Guide tube 62 preferably has a smoothly-tapered, conically-shaped guiding section 75, for guiding flow cell 24 from below into lower aperture 28 and through lower insulator 26. The inner diameter of guide tube 62 at top end 64 is substantially identical to the inner diameter of lower aperture 28. The inner diameter of guide tube 62 at bottom end 65 is larger than the inner diameter at top end 64. The inner diameter of guide tube 62 at bottom end 65 is preferably between 9 mm and 15 mm.

Guide tube 62 can be constructed of one integral piece. For ease of construction, however, guide tube 62 can also be constructed in two or more parts. The first part may be a straight cylinder having a large inner diameter as shown at bottom end 65 in FIG. 2-A. The second part may be a relatively shorter piece of tubing which has a tapered inner surface, preferably conical, defining guiding section 75. The two parts are joined to form one integral guide tube 62.

As shown in FIGS. 2-A and 2-B, probe 20 further comprises an upper insulator 34, supported at a distance above lower insulator 26. As with lower insulator 26, upper insulator 34 is preferably generally circular to fit within probe housing 22, and may contain various apertures, channels, supports and connections for probe subassemblies which are typically housed between upper and lower insulators 34, 26.

Upper insulator 34 has a longitudinal sample-holding upper aperture 38 extending from the top to the bottom of upper insulator 34. Upper aperture 38 is aligned with lower aperture 28, substantially along the longitudinal (vertical) axis of probe 20, and is of sufficient diameter to permit passage of flow cell 24. Flow cell 24 slidably traverses upper insulator 34 through upper aperture 38. Upper aperture 38 preferably has circular transverse cross-sections, and its minimal diameter is preferably the same as that of lower aperture 28.

Upper insulator 34 further comprises a longitudinal sample flow connection tube aperture 76a for accommodating sample outflow connection tube 74. Tube 74 is fluidically connected to flow cell 24. Upper insulator 34 further comprises a second sample flow connection tube aperture (not shown in FIG. 2-B), transversely-adjacent to aperture 76a along the top surface of upper insulator 34.

At least one longitudinal radio-frequency (RF) coil 45 is positioned along the longitudinal axis of probe 20, between upper and lower insulators 34, 26, in the space between flow cell 24 and housing 22. Coil 45 is held in fixed position relative to housing 22 and insulators 34, 26. Coil 45 is preferably incorporated into insert 44, shown in FIG. 2-B. Insert 44 is positioned in the space between flow cell 24 and housing 22, and is adjacent to flow cell 24. Upper insulator 34 flexibly presses down onto insert 44, for holding insert 44 in place and reducing the vibrational motion of insert 44 and the attached coil 45. Upper insulator 34 comprises a flexible pressing structure for engaging and flexibly pressing down on insert 44, as described in more detail below. RF coil 45 may also be free-standing and unconnected to insert 44.

Commonly, and preferably, upper insulator 34 and lower insulator 26 form the top and bottom caps, respectively, of a housing for a pulsed field gradient coil. Such pulsed field gradient coils, as well as RF coils and inserts incorporating RF coils, their use and construction, are well known to those of skill in the art of NMR spectroscopy.

NMR flow cell 24 may be of a variety of designs suitable for use in a continuous flow-through operation. To avoid sample contamination and other chemical compatibility problems, flow cells of inert construction manufactured without chemical adhesive are preferred. A preferred design and construction without chemical adhesives are disclosed in U.S. Pat. No. 5,867,026, entitled "Flow cell for NMR Probe," assigned to the assignee of the present invention, although those of skill in the art will recognize that many other suitable NMR flow cells may be used. Suitable flow cells are typically 15 cm in length and 3 mm to 5 mm in outer diameter.

Flow cell 24 has an inlet end 31, an outlet end 33, and an analysis chamber 41 situated between inlet end 31 and outlet end 31, as shown in FIG. 2-B. Inlet end 31 leads to analysis chamber 41, which in turn leads to outlet end 33. As described in U.S. Pat. No. 5,867,026, flow cell 24 preferably has an inner diameter of small-to-large-to-small geometry from inlet end 31 to analysis chamber 41 to outlet end 33. This small-to-large-to-small geometry reduces the amount of sample (analyte plus solvent) needed to fill analysis chamber 41 and places an increased proportion of the total sample volume into analysis chamber 41. This geometry is useful for samples available in limited quantities, of which liquid chromatography fractions are one example. The geometry also helps maintain chromatographic separation when flow cell 24 is used for chromatographic analysis.

Inlet end 31 and outlet end 33 are preferably formed by thick-walled capillary tubing. The thick walls are mechanically strong and can be made to have low dead-volume (e.g. 0.010" i.d.). The thick-walled capillary tubing provides added strength to flow cell 24 for attaching inflow and outflow tubing 72, 74. The inner diameters of inlet end 31 and outlet end 33 can be selected to be substantially equal to the respective capillary diameters of the eluent inflow tube 72 and outflow tube 74. The inner diameters of inlet end 31 and outlet end 33 are preferably from 0.25 mm to 1 mm, and more preferably from 0.5 mm to 0.75 mm.

As illustrated in FIG. 2-A, inlet and outlet ends 31, 33 are attached by connectors 68a–b to flexible inflow and outflow connection tubes 72, 74, respectively. Suitable connectors 68a–b are preferably compression-style fittings commonly used in LC applications. Such connectors use ferrules and fittings which are positioned on the outside surface ends of the NMR flow cell. This results in a flow cell assembly having regions of larger outer diameter than the outside diameter of flow cell 24 itself.

Figure 4:
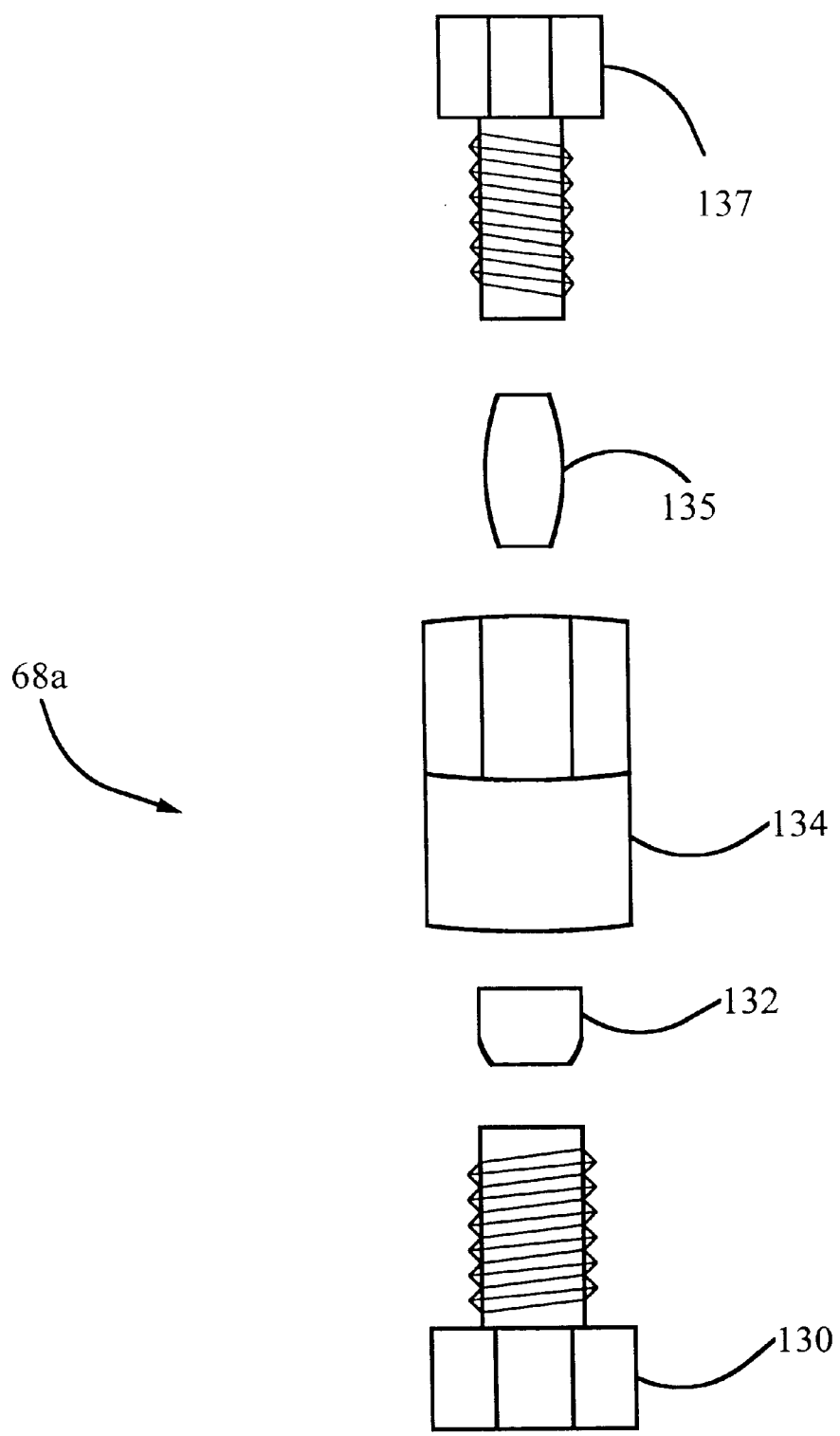
FIG. 4 is a side view of a compression fitting for connecting an NMR flow cell to inflow or outflow tubing, according to the preferred embodiment of the present invention.

A preferred connector 68a is further illustrated in FIG. 4 as comprising a large hex nut 130, a short ferrule 132, a union 134, a long ferrule 135 and a small hex nut 137. The hex nuts, ferrules and union are preferably made of PEEK, PTFE, Kel-F, Tefzel or other materials known to those in the field of HPLC. Connector 68b is identical to connector 68a.

To attach connector 68a to flexible inflow tubing 72, inflow tubing 72 of suitable diameter is passed through small hex nut 137 and long ferrule 135. Small hex nut 137 is threaded into union 134 and the assembly is tightened using appropriate mechanical aids (torque wrenches, fixtures, etc.) to create a compression seal with inflow tubing 72. Inlet end 31 of flow cell 24 is then inserted into large hex nut 130 and small ferrule 132. Large hex nut 130 is threaded into the opposite end of union 134 as inflow tubing 72 and connector 68a are carefully tightened to produce a compression seal on flow cell 24. A similar procedure, in opposite order is used to attach connector 68b to outlet end 33 of flow cell 24, and then to outflow connection tube 74. Connectors 68a–b are easily removed by reversing the procedure described above.

The size of the compression-style fittings places some mechanical limitations on probe 20 and the method of inserting or removing flow cell 24. Because of the large outer diameter of the compression style fittings, it is preferable to attach inflow tubing to inlet end 31 (see FIG. 2-A), then position flow cell 24 in probe 20, and subsequently attach outflow tube 74 to outlet end 33. Although guide tube 62 must have a sufficiently large inner diameter to accommodate connector 68a, the inner diameter of the RF coil 45 and other nested subassemblies in probe 20 can be kept relatively small since only flow cell 24 passes through the region of probe 20 between lower and upper insulators 26, 34. This promotes a better NMR filling factor since the diameter of the RF coil 45 need not be significantly larger than the outer diameter of flow cell 24.

Suitable compression fittings as shown in FIG. 4 are available commercially from Alltech and Upchurch. The union 134 and hex nuts 130 and 137 may be machined to reduce their outer diameter and more readily permit passage through guide tube 62. The outer diameter of the connectors is preferably between 8 mm and 15 mm. Those of skill in the art will recognize that other modifications in the type and size of the ferrules, as well as the size and slope of the connector nuts and union, can be made to accommodate various design modifications. In a separate embodiment, the inlet and outlet ends of the NMR flow cell may be alternatively elongated to extend beyond the probe housing 22 and obviate the need to pass the connector 68a through guide 62 tube at all.

Suitable inflow and outflow tubing are of the type generally used in HPLC applications and well know to those of ordinary skill. Inflow tube 72 supplies fluid to flow cell 24, while outflow tube 74 removes fluid from flow cell 24. Outflow tube 74 may be threaded out the top of probe 20 and then out the top of the magnet's bore when probe 20 is inserted in the magnet. Preferably, outflow tube 74 is rerouted down through sample flow connection tube apertures 76a, 78 formed in upper and lower insulators 34, 26, respectively, and ultimately out the base 80 of probe 20.

Flow cell 24 is not directly attached to an RF coil or any other portion of the probe subassembly mounted between upper and lower insulators 34, 26. Instead, flow cell 24 can move up and down through upper and lower insulators 34, 26, passing through any shields or coils that comprise the probe subassembly. Thus, the traditional inconvenience and risk of unsoldering and resoldering nested assemblies of coils and other structure within the probe subassembly are avoided. Moreover, no additional modification of the probe subassembly is necessary to accommodate flow cell 24. Since only flow cell 24 itself, and not detachable connectors 68a–b, is inserted through the probe subassembly, a desired filling factor for the RF coil can be maintained.

Flow cell 24, upper and lower insulators 34, 26, guide tube 62, and other components of probe 20 are made of suitable non-magnetic materials that will not interfere with NMR measurements. Such non-magnetic materials are well known to those of ordinary skill and include, for example, Kel-F, PTFE and ceramic materials.

FIGS. 5-A shows a longitudinal cross-sectional view of probe 20 in a stationary-sample configuration. FIG. 5-B illustrates the sample-holding area of probe 20 in the stationary-sample configuration. A stationary-sample vessel (test tube) 25 is secured in probe 20, and extends through upper aperture 38. Upper insulator 34 constrains the transverse position of vessel 25 so as to maintain vessel 25 centered within the RF coil of probe 20. The longitudinal position of vessel 25 is held fixed by a conventional fixture (not shown) external to probe 20, situated above upper insulator 34. Stationary-sample vessel 25 preferably has substantially the same transverse size or diameter as flow cell 24 (shown in FIG. 2-A), such that flow cell 24 and stationary-sample vessel 25 sequentially fit snugly through upper aperture 38.

Referring back to FIGS. 5-A and 5-B, stationary-sample vessel 25 holds a sample of interest which does not flow through vessel 25 during the operation of probe 20. The sample is placed into vessel 25 before vessel 25 is inserted into probe 20, and the sample is not removed from vessel 25 while vessel 25 is positioned within probe 20.

While stationary-sample vessel 25 is positioned in probe 20, outflow connection tube 74 is accommodated through flow connection apertures 76a–b and 78. In particular, after passing upward through aperture 78, outflow tube 74 extends out of one of apertures 76a–b and loops back into the other of apertures 76a–b on the external (top) side of upper insulator 34. To facilitate the positioning of stationary-sample vessel 25 through upper insulator 34, upper insulator 34 defines a tapered guiding section 224 along the extent of upper aperture 38, as described in more detail below with reference to FIG. 6-C.

FIGS. 6-A and 6-B show isometric views of upper insulator 34 from the top and bottom, respectively, while FIG. 6-C shows a longitudinal sectional view through upper insulator 34. As shown in FIG. 6-A, upper insulator 34 has a keying-in structure 92 along its top surface. Keying-instructure 92 defines the side walls of part of upper aperture 38, along the top surface of upper insulator 34. Keying-in structure 92 is shaped complementarily to the bottom part of connector 68b (shown in FIG. 2-A), so as to receive and partially enclose connector 68b. The transverse cross-section of keying-in structure 92 is non-circular (e.g. hexagonal), so as to prevent the transverse rotation of connector 68b and flow cell 24, and thus allow tightening or loosening connector 68b. A plurality of longitudinal channels (openings) 94 are defined in the side walls of keying-in structure 92, for allowing temperature-control gas to flow through upper aperture 38 even when connector 68b is seated in keying-in structure 92. Channels 94 extend below keying-in structure 92, to allow the temperature-control gas to escape from underneath connector 68b.

FIG. 6-A further shows two flow connection tube apertures 76a–b formed in upper insulator 34. Apertures 76a–b are transversely adjacent, and extend in a generally-longitudinal direction through upper insulator 34. When probe 20 is in a stationary-sample configuration, outflow connection tube 74 is accommodated through both apertures 76a–b. In particular, as described above, outflow tube 74 extends out of one of apertures 76a–b and loops back into the other of apertures 76a–b on the external (top) side of upper insulator 34.

Apertures 76a–b allow compactly holding tube 74 (shown in FIG. 2-B) within probe 20 when probe 20 is in the stationary-sample configuration. Tube 74 forms a tight loop on the external side of upper insulator 34, and most of the length of tube 74 is held underneath upper insulator 34. The loose end of outflow tube 74 (the end which can be connected to flow cell 24) is held underneath the top surface of upper insulator 34. Similarly, most of the loose length of outflow tube 74 is held on the internal side of upper insulator 34, i.e. underneath upper insulator 34, such that outflow tube 74 does not inconvenience the end user during the operation of probe 20 in the stationary-sample configuration.

Referring now to FIGS. 6-B and 6-C, upper insulator 34 is preferably formed by an outer part 210 affixed to probe housing 22, and a guiding/pressing ring 214 mounted on outer part 210. Outer part 210 is generally ring-shaped, so as to fit within probe housing 22. A longitudinal inner bore 212 extends through outer part 210, for holding ring 214. Guiding/pressing ring 214 is mounted within inner bore 212, and is held in place by a tight friction fit. Flow connection tube apertures 76a–b (shown in FIG. 6-A) are formed in outer part 210.

As shown in FIGS. 6-C and 7, guiding/pressing ring 214 comprises an outer contact section 216 for engaging outer part 210, an inner contact section 218 for engaging and pressing down on insert 44 (see FIG. 2-B) and for guiding stationary-sample vessel 25 through upper insulator 34, and an intermediate section 220 flexibly connecting outer contact section 216 and inner contact section 218. Sections 216, 218, 220 are ring-shaped and concentric. Outer section 216 and inner section 218 are formed by rigid longitudinal walls, while intermediate section 220 is formed by a longitudinally-flexible transverse connective sheet. Ring 214 effectively acts as a longitudinal spring, and also defines part of upper aperture 38.

Inner contact section 218 has a tapered guiding section 224 along the edge of upper aperture 38. Guiding section 224 is tapered such that upper aperture 38 narrows from top to bottom along guiding section 224. Guiding section 224 is preferably a chamfer (counterbore) along the top edge of ring 214. Inner contact section 218 further includes an insert-pressing surface 222 along its bottom, opposite guiding section 224. Surface 222 engages insert 44 (shown in FIG. 2-B), flexibly pressing down on insert 44 and ensuring the mechanical stability of the RF coil of probe 20.

Referring now to FIG. 2-A, to position flow cell 24 in probe 20, inlet end 31 is attached to inflow tubing 72 using connector 68a. Flow cell 24 is then slid into place through upper and lower insulators 34, 26 via guide tube 62. Outlet end 33 of flow cell 24 is then attached by connector 68b to outflow tube 74. Connector 68b attached to flow cell 24 is then seated in the key or notch in the top of upper insulator 34. Flow NMR spectral measurements are then performed on a sample of interest. The procedure described above is reversed to remove flow cell 24 from probe 20, before stationary-sample NMR spectral measurements are performed on another sample of interest. Stationary-sample vessel 25 can be simply slid down through upper insulator 34 from above, and longitudinally constrained by a conventional fixture external to probe 20. Once stationary-sample vessel 25 is secured in place, NMR measurements are performed on the sample situated in vessel 25.

In the preferred embodiment, flow cell 24 and stationary-sample vessel 25 have the same outer transverse shape and size (diameter), and upper insulator 34 is left unchanged as probe 20 is converted between its stationary-sample and flow configurations. In an alternative embodiment, flow cell 24 and stationary-sample vessel 25 may have different outer sizes. Different centering rings can then be provided for centering each of flow cell 24 and stationary-sample vessel 25 within probe 20.

FIG. 8-A shows an alternative NMR probe 320 of the present invention in a flow configuration. Probe 320 differs from probe 20 in the design of its guide tube 362 and upper insulator 334. Guide tube 362 is not tapered. Upper insulator 334 is shown in FIG. 8-A in a flow configuration. In the flow configuration, upper insulator 334 comprises two distinct parts: a fixed outer part 310 affixed to probe housing 22, and a flow-cell centering ring 340 removably mounted on outer part 310, within a longitudinal inner bore 312 defined in outer part 310. The components of probe 320 other than upper insulator 334 can be similar to the components of probe 320. Preferably, ring 340 rests on an upper surface of outer part 310. Ring 340 may also be secured to outer part 310 with conventional fasteners such as set screws, or can be held in place through a press or friction fit.

Ring 340 has a longitudinal inner sample-holding aperture 338 of a sufficient size to allow slidably traversing flow cell 24 therethrough. The top of flow cell centering ring 340 is keyed or notched to accommodate the lower end of connector 68b and hold the attached flow cell 24 in position in probe 320. Ring 340 acts as a spacer to center flow cell 24 along the longitudinal axis of probe 320.

A preferred design for flow cell centering ring 340 is shown in FIGS. 9-A through 9-C. Ring 340 has a cylindrical portion 113 and an upper constraint 110 for disposition inside upper insulator 34. Upper constraint 110 bears against an upper surface of upper insulator 334 (shown in FIGS. 8-A).

A lower constraint or ridge 109 in the inner aperture at the bottom of flow cell centering ring 340 accommodates the upper end of insert 44 (shown in FIG. 8-A). Constraint 109 bears against the top of insert 44 to align insert 44 along the probe axis and secure it in place in the probe. Ring 340 preferably presses down on insert 44 and its attached RF coil(s).

Flow cell centering ring 340 may also comprise channels 114 or other holes to direct air flow around the outside of NMR flow cell 24. The use of such channels or holes is well known in the art for adjusting the temperature of flow cell 24 and its sample during spectroscopic measurements.

As shown in FIG. 9-A, flow cell centering ring 340 is preferably notched or keyed 112 on top to accommodate the hexagonal head 131 of hex nut 130, to allow the connector to sit in flow cell centering ring 340 and position flow cell 24 for spectral measurements. The notch or key 112 can also be used to aid in tightening or loosening the compression-style fitting on the outlet end of the NMR flow cell. Flow cell centering ring 340 is preferably machined for two parallel outer surfaces 111, as shown in FIGS. 9-A and 9-C, to allow flow cell centering ring 340 to sit in upper insulator 34 without rotating and make it simpler to secure flow cell centering ring 340 in position.

FIG. 8-B illustrates probe 320 in a stationary-sample configuration. Upper insulator 334 is shown in its stationary-sample configuration. In the stationary-sample configuration, upper insulator 334 is formed by fixed outer part 310, and a stationary-sample vessel centering ring 344 removably mounted on outer part 310, within inner bore 312.

In the stationary-sample configuration, sample-holding aperture 338 is formed within ring 344. Aperture 338 is of a sufficient size to allow slidably traversing stationary-sample vessel 25 therethrough. Stationary-sample vessel 25 extends through aperture 338, and is centered within probe 320 by ring 344. Outflow tube 74 extends through adjacent longitudinal flow-connection tube apertures (only one aperture 376a shown in FIG. 8-B) formed in outer part 310, forming a tight loop 313 above upper insulator 334.

FIG. 10-A shows an isometric view of ring 344, while FIG. 10-B show a top plan views of ring 344 positioned in outer part 310. As illustrated in FIG. 10-A, ring 344 comprises a top cover section 302, a middle keying-in section 304, and a bottom section 306. Cover section 302 rests above outer part 310, and allows the end user to manually remove ring 344 from outer part 310. Keying-in section 304 has a non-circular tranverse cross-section along at least part of its longitudinal extent. An outer lateral flat surface 305 of keying-in region 304 engages outer part 310, and prevents ring 344 from transversely rotating while positioned in upper insulator 334. Bottom section 306 serves to provide lateral stability and support to stationary-sample vessel 25. Aperture 338 can have a different diameter, for example smaller, in the stationary-sample configuration than in the flow configuration.

Stationary-sample vessel centering ring 344 has an edge clearance aperture 308 along the outside edge of its upper surface, for accommodating the loop formed by outflow tube 74. Clearance aperture 308 is aligned with (positioned along) flow connection tube apertures 376a–b. Clearance aperture 308 is needed only if the radial space available within the probe is sufficiently limited, or if apertures 376a–b are positioned sufficiently close to ring 344. The need for clearance aperture 308 can be eliminated by moving apertures 376a–b radially outward along upper insulator 334.

An end user in the field can conveniently convert probe 320 between its flow and stationary-sample configurations, without removing the probe housing 22, as can be understood with reference to FIGS. 8-A and 8-B. To convert probe 320 to a flow configuration, flow cell 24 is first connected to inflow tube 72 by connector 68a, outside probe 320. Flow cell 24 is then guided from below through guide tube 62 and slidably disposed through lower insulator 26 and upper part 310, with the outlet end of flow cell 24 extending beyond the top surface of upper part 310. Flow cell centering ring 340 is then slid over the outlet end of flow cell 24 and is disposed inside the sample-holding aperture of upper part 310. The outlet end of flow cell 24 is attached to outflow tube 74 with connector 68b and the lower end of connector 68b is positioned in the key or notch on the top of flow cell centering ring 340.

To convert probe 320 to a stationary-sample configuration, the above-described procedure is simply reversed. Flow-cell centering ring 340 is then replaced in upper part 310 by stationary-sample vessel centering ring 344, and stationary-sample vessel 25 is inserted from above through ring 344.

It will be clear to one skilled in the art that the above embodiments may be altered in many ways without departing from the scope of the invention. The inlet end of the NMR flow cell can be elongated sufficiently at the inlet end to extend entirely through the guide tube and out the bottom end of the probe. In such an embodiment, the inner diameter of the guide tube can be substantially reduced to a size sufficient to allow only the flow cell to slide through. The outer diameter of the guide tube could also be reduced accordingly, which would be particularly advantageous in probes having limited internal space.

If desired, the inlet and outlet ends of the flow cell can be elongated sufficiently to extend beyond the ends of the probe housing for connecting to inflow and outflow tubing external to the probe. Using such an elongated flow cell eliminates the insertion of any connector to inflow or outflow tubing within the probe housing. This has the dual benefit of keeping the connectors away from the mechanically and electrically sensitive portions of the probe and allowing a smaller outer diameter guide tube to be used when internal probe space is very limited.

Different connectors may be used in place of the compression-style fittings illustrated above without deviating from the spirit of the invention. For example, other connectors with a suitably small outside diameter may be used in the invention, which would permit connection of flexible tubing to the inlet and outlet ends of the NMR flow cell before it is inserted into the probe. Moreover, the inlet end of the cell can be permanently sealed or attached to the inflow tubing before the flow cell is positioned in the probe. To the extent such a permanent seal employed a chemical bonding or adhesive, however, it could give rise to chemical compatibility problems and sample contamination. Thus, detachable connectors are preferred for use at both ends of the flow cell.

A spacer ring sized to snugly fit through the guide tube may be mounted around the lower part of the flow cell, for facilitating the passage of the flow cell through the guide tube and for aligning the flow cell with the lower insulator aperture. Such a spacer ring may be used with an untapered guide tube. The inner bore of the spacer ring is of a sufficient size to allow slidably traversing the flow cell while forming a snug friction fit and remaining in place on the flow cell. The spacer ring can act as a spacer for the NMR flow cell as the flow cell is inserted into the probe through the guide tube.

Additional tools and aids may be used to insert the flow cell into the probe. For example, a fitting housing can be placed over the inflow connector and then attached to a push rod to transfer the flow cell through the guide tube. The fitting housing and push rod can be removed once the flow cell is in place in the probe.

While in the preferred embodiment the upper insulator outer part and the guiding/pressing ring are distinct parts (for ease of machining), the upper insulator outer part and the guiding/pressing ring may be integrally formed as a single monolithic part. The lower insulator could be monolithic.

Tapered guides (guiding sections) for guiding the flow cell and stationary-sample vessel need not necessarily be defined by the guide tube and upper-insulator, respectively. Generally, guides tapered in opposite directions can be placed anywhere in the insertion paths of the flow cell and stationary-sample vessel. For example, the lower insulator can include a tapered guiding section along its longitudinal sample-holding aperture, for guiding the flow cell from the bottom into the lower insulator aperture. Accordingly, the scope of the invention should be determined by the following claims and their legal equivalents.

What is claimed is:

1. A dual-function nuclear magnetic resonance probe comprising:
   a) a radio-frequency coil for applying radio-frequency energy to a sample;
   b) an upper insulator held in fixed position above said radio-frequency coil, said upper insulator having an upper longitudinal sample-holding aperture for sequentially centering a stationary-sample vessel and a flow cell in said radio-frequency coil, said upper aperture having a tapered guiding section for guiding said stationary-sample vessel from above through said upper insulator;
   c) a lower insulator held in fixed position below said coil, said lower insulator having a lower longitudinal sample-holding aperture aligned with said upper sample-holding aperture, for centering said flow cell within said radio-frequency coil; and
   d) a guide tube held in fixed position below said lower insulator, for guiding said flow cell from below through said lower sample-holding aperture.

2. The probe of claim 1 wherein said upper insulator comprises an outer part having a longitudinal inner bore, and a guiding ring mounted within said inner bore, said guiding ring defining said tapered guiding section.

3. The probe of claim 2 wherein said tapered guiding section is formed by a chamfer at an upper edge of said guiding ring.

4. The probe of claim 1 wherein said upper insulator comprises:
   a) an outer part having a longitudinal inner bore; and
   b) a pressing ring mounted in said inner bore, for flexibly pressing longitudinally on an insert of said probe, said pressing ring comprising an outer contact section for engaging said outer part, an inner contact section for engaging said insert, and a longitudinally-flexible intermediate section flexibly connecting said outer section and said inner section.

5. The probe of claim 4 wherein said pressing ring defines said tapered guiding section.

6. The probe of claim 1 further comprising a sample flow connection tube extending through said upper insulator while said stationary-sample vessel extends through said upper insulator.

7. The probe of claim 1 wherein said upper insulator has at least two sample flow connection tube apertures formed therein, for passing a sample flow connection tube through said upper insulator such that said sample flow connection tube extends out from one of said flow connection tube apertures and into another of said flow connection tube apertures on an external side of said insulator while said stationary-sample vessel extends through said upper insulator.

8. The probe of claim 1 wherein said upper insulator comprises a keying-in structure for receiving a flow cell connector.

9. The probe of claim 1 wherein, while said stationary-sample vessel extends through said upper insulator, said upper insulator is formed by an outer part having a longitudinal inner bore, and a stationary-sample vessel centering ring positioned within said inner bore, for centering said stationary-sample vessel in said radio-frequency coil.

10. The probe of claim 9 wherein, while said flow cell extends through said upper insulator, said upper insulator is formed by said outer part and a flow cell centering ring positioned within said inner bore, for centering said flow cell in said radio-frequency coil.

11. A dual-function nuclear magnetic resonance probe comprising:
    a) an insulator having a longitudinal sample-holding aperture with a tapered guiding section for guiding a test tube through said sample-holding aperture; and
    b) a flow cell positioned through said sample-holding aperture while said test tube is absent from said sample-holding aperture.

12. A dual-function nuclear magnetic resonance probe comprising:
    a) an insulator having a longitudinal sample-holding aperture;
    b) a stationary-sample vessel positioned through said sample-holding aperture; and
    c) a guide tube held in fixed position relative to said insulator, for guiding a flow cell through said sample-holding aperture while said stationary-sample vessel is absent from said sample-holding aperture.

13. The probe of claim 12 further comprising a sample flow connection tube for fluidically connecting to said flow cell, said sample flow connection tube extending through said insulator while said stationary-sample vessel is positioned through said sample-holding aperture.

14. The probe of claim 12 wherein said upper insulator comprises a keying-in structure for receiving a flow cell connector.

15. A centering kit for a dual-function nuclear magnetic resonance probe, comprising:
    a) a nuclear magnetic resonance probe assembly comprising
       an insulator outer part having a longitudinal inner bore formed therein, and
       a longitudinal radio-frequency coil held in fixed position relative to said outer part;
    b) a flow-cell centering ring for centering a flow cell within said radio-frequency coil, said flow-cell centering ring having
       a flow-cell outer surface sized to fit into said longitudinal inner bore, and
       a flow-cell longitudinal inner aperture sized to hold said flow cell therethrough, for centering said flow cell within said radio-frequency coil; and
    c) a stationary-sample vessel centering ring for centering a stationary-sample vessel within said radio-frequency coil, said stationary-sample vessel centering ring having
       a stationary-sample vessel outer surface sized to fit into said inner bore, and
       a stationary-sample vessel longitudinal inner aperture sized to hold said stationary-sample vessel therethrough, for centering said stationary-sample vessel within said radio-frequency coil.

16. The kit of claim 15 said flow-cell aperture has a different transverse size than said stationary-sample vessel aperture.

17. The kit of claim 15 wherein said outer part has a sample flow connection tube aperture formed therein, for passing a sample flow connection tube through said outer part while said stationary-sample vessel centering ring is positioned in said inner bore.

18. The kit of claim 17 wherein said stationary-sample vessel centering ring has an edge clearance aperture for accommodating said sample flow connection tube while said stationary-sample vessel centering ring is positioned in said inner bore.

19. The kit of claim 15 wherein said outer part has at least two sample flow connection tube apertures formed therein, for passing a sample flow connection tube through said outer part while said stationary-sample vessel centering ring is positioned in said inner bore, such that said sample flow connection tube extends out from one of said sample flow connection tube apertures and into another of said sample flow connection tube apertures on an external side of said outer part.

20. A nuclear magnetic resonance measurement method comprising the steps of:
   a) centering a stationary-sample vessel in a radio-frequency coil of a nuclear magnetic resonance probe by disposing said stationary-sample vessel through a longitudinal aperture of an insulator in said probe;
   b) performing a nuclear magnetic resonance measurement on a sample situated in said stationary-sample vessel;
   c) removing said stationary-sample vessel from said insulator;
   d) centering a flow cell in said radio-frequency coil by disposing said flow cell through said longitudinal aperture; and
   e) performing a nuclear magnetic resonance measurement on a sample situated in said flow cell.

21. The method of claim 20 wherein said longitudinal aperture has a tapered guiding section for guiding said stationary-sample vessel into said insulator, and said step of disposing said stationary-sample vessel through said longitudinal aperture comprises a step of sliding said stationary-sample vessel through said tapered guiding section.

22. The method of claim 20, further comprising the step of flexibly pressing longitudinally said insulator onto an insert of said probe, said insert being coupled to said radio-frequency coil.

23. The method of claim 20 wherein said step of disposing said stationary-sample vessel through said longitudinal aperture comprises the steps of inserting a stationary-sample vessel centering ring into an inner bore formed in an outer part of said insulator, and sliding said stationary-sample vessel through said stationary-sample vessel centering ring.

24. The method of claim 20 wherein said step of disposing said flow cell through said longitudinal aperture comprises the steps of inserting a flow cell centering ring into said inner bore, and sliding said flow cell through said flow cell centering ring.

* * * * *